(12) United States Patent
Nakayama (10) Patent No.: US 9,281,680 B2
(45) Date of Patent: Mar. 8, 2016

(54) POWER SWITCHING CIRCUIT (71) Applicant: Yasushi Nakayama, Chiyoda-ku (JP)

(72) Inventor: Yasushi Nakayama, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 98 days.

(21) Appl. No.: 14/364,092

(22) PCT Filed: Feb. 8, 2013

(86) PCT No.: PCT/JP2013/053000
§ 371 (c)(1),
(2) Date: Jun. 10, 2014

(87) PCT Pub. No.: WO2013/125366
PCT Pub. Date: Aug. 29, 2013

(65) Prior Publication Data
US 2014/0321012 A1 Oct. 30, 2014

(30) Foreign Application Priority Data
Feb. 24, 2012 (JP) .................. 2012-038118

(51) Int. Cl.
H02H 3/08 (2006.01)
H02H 9/02 (2006.01)
H02M 1/088 (2006.01)
H02M 1/32 (2007.01)
H03K 17/082 (2006.01)
H02H 3/00 (2006.01)
H02H 9/00 (2006.01)
H02M 1/00 (2007.01)

(52) U.S. Cl.
CPC .............. *H02H 9/025* (2013.01); *H02M 1/088* (2013.01); *H02M 1/32* (2013.01); *H03K 17/0822* (2013.01); *H02M 2001/0009* (2013.01); *H03K 2217/0027* (2013.01)

(58) Field of Classification Search
CPC ................. H01L 2924/00; H01L 2924/00014; H02H 9/02; H02H 3/08
USPC ........................................... 361/93.1
See application file for complete search history.

(56) References Cited

U.S. PATENT DOCUMENTS 6,768,623 B1 * 7/2004 Shen ................ H02H 3/087
361/31
2006/0238144 A1 * 10/2006 Ando ................ F02P 17/12
315/307

(Continued)

FOREIGN PATENT DOCUMENTS

| JP | 6-54552 | 2/1994 |
|---|---|---|
| JP | 6-77796 | 3/1994 |
| JP | 2008-211703 | 9/2008 |

OTHER PUBLICATIONS

International Search Report issued Apr. 16, 2013, in PCT/JP2013/053000, filed Feb. 8, 2013.

*Primary Examiner* — Dharti Patel
(74) *Attorney, Agent, or Firm* — Oblon, McClelland, Maier & Neustadt, L.L.P.

(57) ABSTRACT

A power switching circuit includes a power semiconductor element that includes a main switching element connected in parallel with a main body diode and a sense switching element connected in parallel with a sense body diode; a reverse overcurrent detection circuit that detects an overcurrent flowing in the reverse direction out of currents flowing through a parallel-connection body of the sense switching element and the sense body diode; and a control circuit that drives the gate of the power semiconductor element; wherein when the reverse overcurrent detection circuit detects a reverse overcurrent, the control circuit controls the main switching element and the sense switching element to turn on.

9 Claims, 8 Drawing Sheets

(56) References Cited

U.S. PATENT DOCUMENTS

| | | | |
|---|---|---|---|
| 2008/0204958 A1* | 8/2008 | Shearon | H02H 3/18 361/93.9 |
| 2008/0205100 A1 | 8/2008 | Sakamoto | |
| 2010/0231257 A1* | 9/2010 | Baddela | H03K 17/18 326/62 |
| 2012/0139347 A1* | 6/2012 | Hackenberg | H02J 1/10 307/71 |
| 2013/0223114 A1 | 8/2013 | Nakayama et al. | |

* cited by examiner

POWER SWITCHING CIRCUIT

TECHNICAL FIELD

The present invention relates to a power switching circuit for protecting a diode connected in parallel with a switching element incorporated in a power semiconductor element, when an overcurrent flows through the power semiconductor element provided with a sense switching element.

BACKGROUND ART

As to conventional protection of a power switching circuit, protection against an overcurrent in an inverter is disclosed in, for example, Patent document 1. In this Patent document 1, when an overcurrent flows, a gate voltage control circuit operates so that an output interruption signal does not suddenly interrupt the overcurrent during its operation. Moreover, all switching elements are made turned off in the overcurrent protection operation.

In addition, for example, Patent document 2 describes a synchronous rectification system as driving a switching element to turn on, when an inductive load is driven, in the fly-back mode of a current flowing in the direction opposite to the forward direction of the switching element, and minimizing a voltage drop across the switching element. Moreover, it is also described that a dead time is shortened to a minimal level in this synchronous rectification system, whereby a free-wheel diode can be eliminated.

When an overcurrent exceeding a certain current level flows through a power semiconductor element, the element is likely to break down, so a function of protecting the element from the overcurrent is required. As the protection function against the overcurrent, a system is widely known in which the power semiconductor element includes a main switching element through which a main current flows and a sense switching element through which part of the main current flows, and the current flowing through the sense switching element is detected, thereby interrupting the main current. For example, a system is disclosed in Patent document 3, in which the gate of a main transistor, which is the main switching element, is separated from that of a sense transistor, which is the sense switching element; meanwhile, in the conventional example of Patent document 3 is also described such a case as a common gate being provided.

PRIOR ART DOCUMENT

Patent document
  Patent document 1: Japanese Laid-open Patent Publication No. H06-054552
  Patent document 2: Japanese Laid-open Patent Publication No. 2008-211703
  Patent document 3: Japanese Laid-open Patent Publication No. H06-77796

DISCLOSURE OF THE INVENTION

Problem to be Solved by the Invention

If all the switching elements are turned off at the occurrence of an overcurrent as shown in Patent document 1, the overcurrent flows only through diodes connected in parallel to the switching elements, which will likely deteriorate the diodes. Moreover, when a synchronous rectification system as shown in Patent document 2 is adopted, particularly when a free-wheel diode is eliminated so as to allow the overcurrent to flow through a body diode, if the overcurrent capacity of the diode connected in parallel to the switching element is low, the diode is likely to be deteriorated, and in the worst case, this would likely lead to its break down. Furthermore, Patent document 3 shows a system in which an overcurrent is detected by a current flowing through the sense transistor, thereby interrupting the overcurrent; however, when an inductive load is used, the overcurrent flows through the diode after the interruption.

The present invention has been made to solve the foregoing problem, and aims at providing a power switching circuit in which even if an overcurrent occurs, a current flowing through a diode connected in parallel with a switching element is suppressed, so that the diode can be protected from deteriorating or breaking down due particularly to the overcurrent.

Means for Solving the Problem

The present invention comprises: a power semiconductor element that includes a main switching element connected in parallel with a main body diode and a sense switching element connected in parallel with a sense body diode; a reverse overcurrent detection circuit that detects an overcurrent flowing in the reverse direction out of currents flowing through a parallel-connection body of the sense switching element and the sense body diode; and a control circuit that drives the gate of the power semiconductor element; wherein when the reverse overcurrent detection circuit detects a reverse overcurrent, the control circuit controls the main switching element and the sense switching element to turn on.

Advantage of the Invention

According to this invention, when a reverse overcurrent is detected, the main switching element is turned on; therefore the reverse overcurrent is divided to flow through the main switching element and its body diode, so that the body diode can be protected from the reverse overcurrent.

EMBODIMENTS FOR CARRYING OUT THE INVENTION

Embodiment 1

Figure 1:
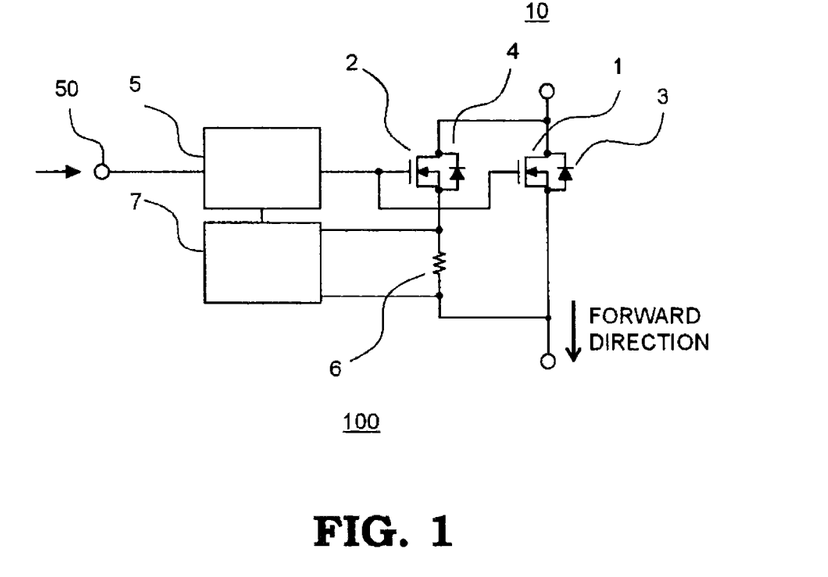
FIG. 1 is a circuit diagram showing a power switching circuit according to Embodiment 1 of the present invention.

FIG. 1 is a circuit diagram showing a power switching circuit according to Embodiment 1 of the present invention. Here, a power switching circuit 100 using MOSFETs as a power semiconductor element will be explained as an example. The power semiconductor element 10 of the power switching circuit 100 includes a main MOSFET 1 as a main switching element, a main body diode 3 connected in parallel to this main MOSFET 1, a sense MOSFET 2 as a sense switching element, and a sense body diode 4 connected in parallel to this sense MOSFET 2. The power switching circuit 100 also includes a control circuit 5 that controls the on-off operation of the main MOSFET 1 and sense MOSFET 2. In addition, the power switching circuit 100 includes a reverse overcurrent detection circuit 7 that detects an overcurrent flowing in the reverse direction of the main MOSFET 1 and sense MOSFET 2, which is opposite to the forward direction of these MOSFETs indicated by the arrow (hereinafter referred to as the forward direction), with a voltage drop generated by a current flowing through a sense resistor 6 being input thereto.

The main MOSFET 1 includes more MOSFET cells than the sense MOSFET 2, and the ratio is, for example, several thousands to several tens of thousands to one. Therefore, a current flowing through the switching elements is divided to flow through the main MOSFET 1 and sense MOSFET 2 depending on the ratio. The current flowing through the sense MOSFET 2 is detected by the voltage drop across the sense resistor 6 connected in series with the sense MOSFET 2, and the main current can be detected from the current-dividing ratio in accordance with the sense cell ratio. Moreover, the main MOSFET 1 and sense MOSFET 2 are provided with the main body diode 3 and sense body diode 4, respectively; therefore, when the main MOSFET 1 and sense MOSFET 2 are in an off-state, a current flowing through these body diodes, that is, a reverse current, can be also detected.

The reverse overcurrent detection circuit 7 detects by the voltage drop across the sense resistor 6 whether or not an overcurrent is flowing in the reverse direction, which can be configured with a general-use comparator circuit. For example, the circuit can be configured with a comparator or the like that compares a reference voltage for setting an overcurrent detection level with the voltage across the sense resistor. Additionally, the sense resistor is used here to convert the current flowing through the sense body diode into the voltage; however the current flowing through the sense body diode only has to be detected, so the circuit does not necessarily need to use the sense resistor, but may be, for example, a circuit utilizing a virtual short of an operational amplifier.

Figure 2:
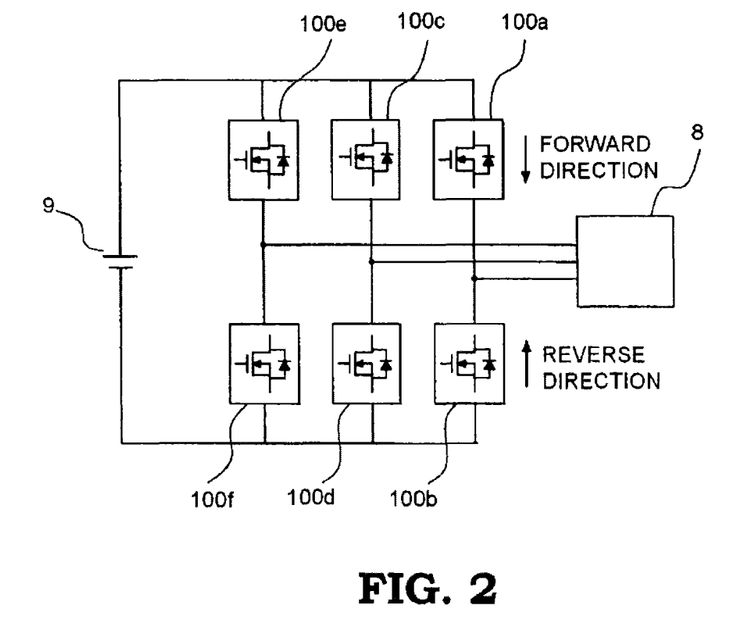
FIG. 2 is a view showing an example of a power conversion device adopting power switching circuits according to the present invention.

The operation of the power switching circuit according to this Embodiment 1 will be explained using FIG. 1, FIG. 2 and FIG. 3. FIG. 2 shows an example of a power conversion device that is a three-phase power inverter configured using six power switching circuits identical to the power switching circuit 100 shown in FIG. 1, that is, power switching circuits (hereinafter each referred to as an arm) 100a, 100b, 100c, 100d, 100e, and 100f, and converts a DC current from a DC power supply 9 into an AC current, so as to supply the current to an inductive load 8. In a power conversion device that drives an inductive load as described above, when an overcurrent flows in the forward direction through a switching element of, for example, the arm 100a in one of the sides, and the element where the overcurrent is flowing is turned off to interrupt the overcurrent so as to protect it, the overcurrent flows through the diode of the opposite side arm 100b immediately after the interruption. Therefore, if the overcurrent capacity of the diode is low, the diode is likely be deteriorated, and in the worst case, this would likely lead to its break down, so the diode needs to be protected. Additionally, the three-phase inverter in FIG. 2 is shown as an example of a power conversion device adopting this invention; this invention can also be applied to circuits, such as a converter and a chopper, other than the inverter.

When a reverse overcurrent flows through the circuit shown in FIG. 1, the overcurrent is divided to flow through the main body diode 3 and sense body diode 4. The voltage drop across the sense resistor 6 at this moment becomes greater than that generated by a reverse current flowing therethrough in the normal operation; therefore, the reverse overcurrent detection circuit 7 can detect the overcurrent, the detected signal is input to the control circuit 5, and the control circuit thereby turns on the main MOSFET 1 and sense MOSFET 2. By turning on these switching elements, the overcurrent is divided to flow through the main MOSFET 1, the sense MOSFET 2, the main body diode 3, and the sense body diode 4. As a result, the currents flowing through the main body diode 3 and sense body diode 4 become lower, so that each body diode can be protected from the overcurrent. Moreover, when the currents decrease, the reverse overcurrent detection circuit 7 stops detecting the reverse overcurrent, and then the control circuit 5 turns off the switching elements, whereby the currents can be interrupted without any current flowing in the forward direction again. The level to stop detecting the reverse overcurrent may be made lower than the level to detect the reverse overcurrent, by providing hysteresis to the reverse overcurrent detection circuit 7.

The operation described above will be explained in more detail using the time chart in FIG. 3. FIG. 3 is a time chart for explaining the operation of the arm 100a, an upper arm, and the arm 100b, a lower arm, connected to the same output terminal as the arm 100a. Here, the reference numerals for constituent parts of the arm 100a are suffixed with "a" and those for constituent parts of the arm 100b are suffixed with "b" to the reference numerals in FIG. 1, and then the operation is explained. For example, the control circuit of the arm 100a is expressed as a control circuit 5a.

Figure 3:
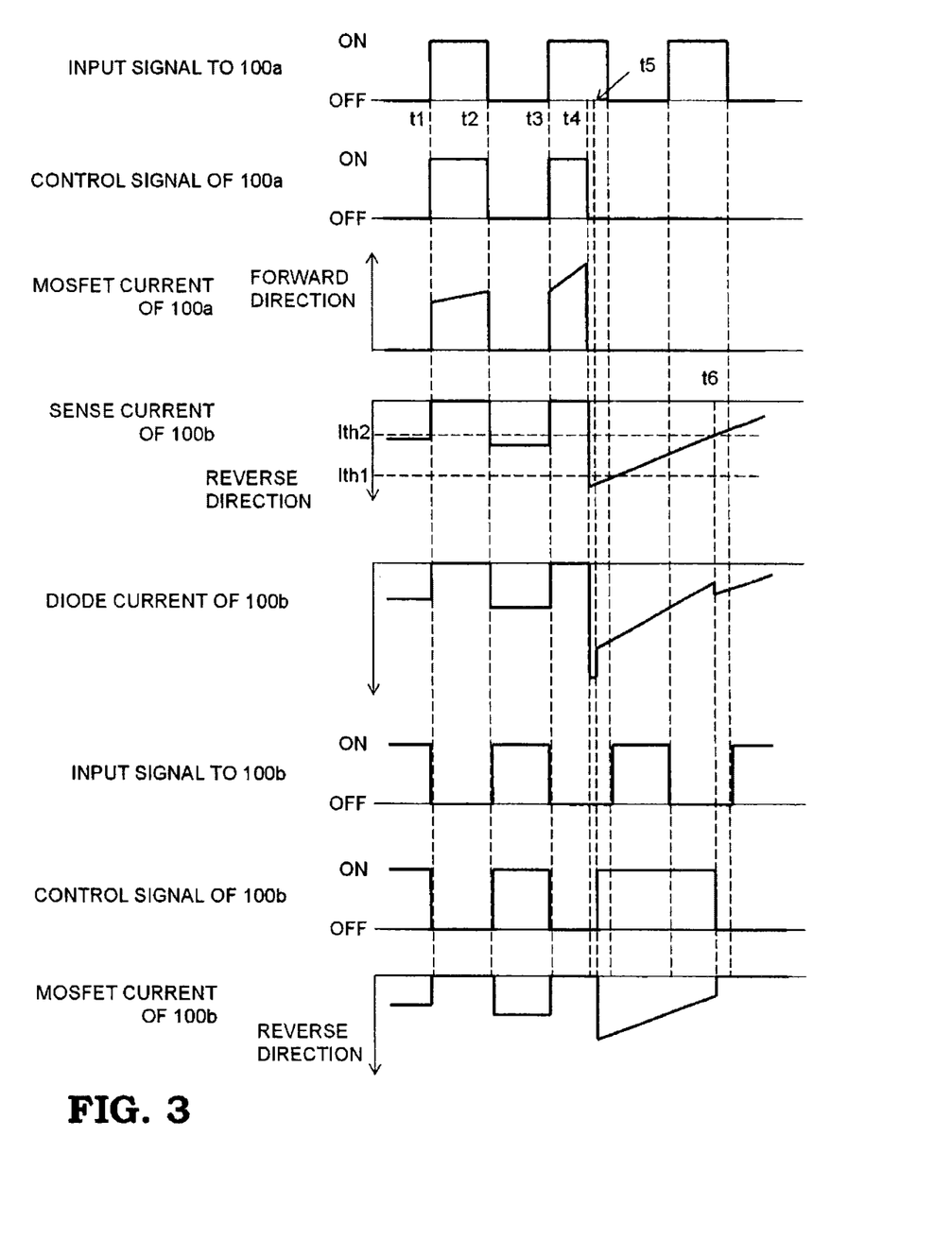
FIG. 3 is a time chart for explaining the operation of the power switching circuit according to Embodiment 1 of the present invention.

Input signals each to the arm 100a and arm 100b shown in FIG. 3 are an on/off signal in the normal operation, which are input to the input terminal 50a of the control circuit 5a and the input terminal 50b of the control circuit 5b. In the normal operation, the control circuit 5a and control circuit 5b take on/off control of MOSFETs, which are their respective switching elements, according to these input signals. The MOSFETs 1a and 2a of the arm 100a are turned on at time t1, and a current flow through the MOSFETs. When the MOSFETs 1a and 2a of the arm 100a are turned off at time t2, the current flowing through the arm 100a becomes zero, and the current flows through the body diodes 3b and 4b of the arm 100b of the lower arm. As soon as the current starts flowing through the body diodes 3b and 4b, the control circuit 5b of the arm 100b turns on the MOSFETs 1b and 2b of the arm 100b. However, in order for the MOSFETs 1a and 2a of the arm 100a and MOSFETs 1b and 2b of the arm 100b never to turn on at the same time, the MOSFETs 1b and 2b of the arm 100b are made turned on after a certain dead time provided therebetween. Additionally, although the current flowing through the diodes during the dead time is large compared to when the MOSFETs are not turned on, the dead time is short enough, so this current is ignored in FIG. 3. The foregoing on-off operation of the MOSFETs 1a and 2a of the arm 100a and the MOSFETs 1b and 2b of the arm 100b is repeated in the normal operation.

As the MOSFET current waveform of the arm 100a shown in FIG. 3, when an overcurrent is detected due to any abnormality, such as a load short, after the MOSFETs 1a and 2a of the arm 100a are turned on at time t3, the control circuit 5a of the arm 100a forcibly turns off the MOSFETs 1a and 2a of the arm 100a at time t4 in order to protect these MOSFETs. Additionally, detection of an overcurrent may be made by an inverter output current, other than detecting it by a forward overcurrent detection circuit as in Embodiment 3 and Embodiment 4 described later; various publicly-known methods of detecting an overcurrent can be used. In addition, the signal input to the arm 100a remains on in FIG. 3 even when the overcurrent is detected; however, the overcurrent is detected by an external circuit and a turn-off signal may be input thereto.

When the MOSFETs 1a and 2a of the arm 100a are turned off, the overcurrent flows through the body diodes 3b and 4b of the arm 100b of the lower arm. A current flowing through the sense resistor Gb of the arm 100b, that is, a sense current, is shown in FIG. 3 as the sense current of the arm 100b. When the value of this sense current in the reverse direction becomes greater than a predetermined threshold value Ith1, the reverse overcurrent detection circuit 7b detects that a reverse overcurrent flows through the body diodes 3b and 4b, and then the detection signal is input to the control circuit 5b of the arm 100b. Thereby, the control circuit 5b of the arm 100b turns on the MOSFETs 1b and 2b of the arm 100b regardless of the signal being input to the arm 100b. Since the control circuit turns on the MOSFETs 1b and 2b after detecting the overcurrent, time t4 at which the overcurrent is detected is not the same as time t5 at which the MOSFETs 1b and 2b are turned on; however, the MOSFETs 1b and 2b can be turned on with an extremely short time lag of, for example, some several hundred nano-seconds to several micro-seconds, so that the body diodes 3b and 4b can be protected.

When the MOSFETs 1b and 2b of the arm 100b are turned on, the overcurrent is divided to flow through both of the body diodes and MOSFETs of the arm 100b, as represented by the diode current and MOSFET current of the arm 100b shown in FIG. 3; therefore, the values of the currents flowing through the diodes are lowered, so that the body diodes can be protected. Following that, the MOSFETs 1b and 2b of the arm 100b are turned off at time t6 at which the absolute value of the sense current decreases to lower than Ith2. By turning off the MOSFETs 1b and 2b, the MOSFET current can be interrupted without any current flowing in the forward direction again.

Additionally, an example using MOSFETs as the switching elements has been presented; however, the elements do not necessarily need to be MOSFETs as long as they are elements capable of switching bidirectionally. Moreover, the switching elements may be made of wide bandgap semiconductor with a wider bandgap than silicon, other than those made of silicon. The wide bandgap semiconductor includes, for example, silicon carbide (SiC), gallium nitride-based material, and diamond. When the wide-bandgap semiconductor is used, its high allowable current density and low power loss will make it possible to miniaturize a device using power semiconductor elements. Furthermore, if the wide-bandgap semiconductor is used for switching elements, the withstand voltage of the elements, such as MOSFETs, capable of bidirectionally switching will be raised, thereby enabling their applications to extend to a higher voltage region. When the overcurrent capacity of body diodes of the switching elements is low, this invention will be particularly effective.

Embodiment 2

Figure 4:
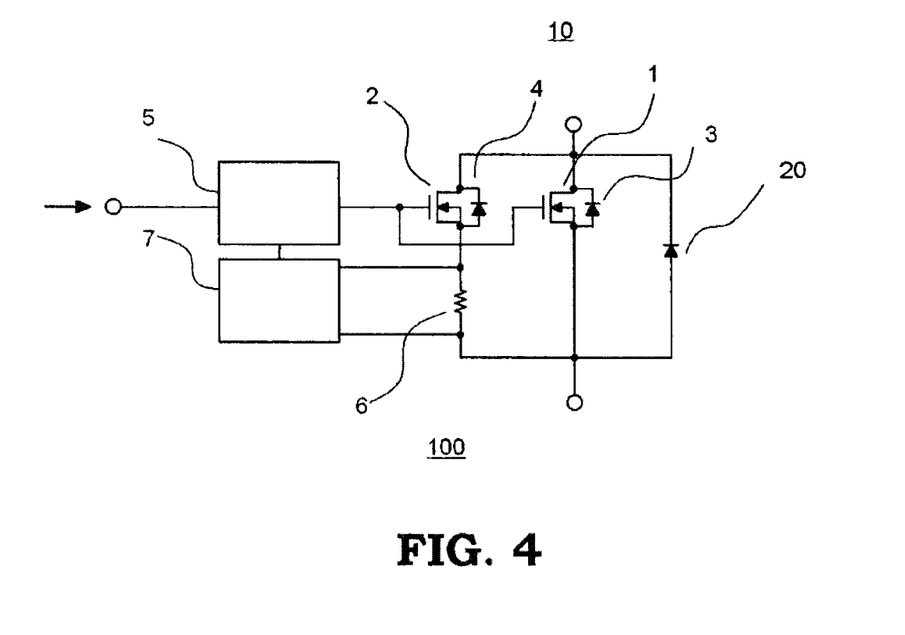
FIG. 4 is a circuit diagram showing a power switching circuit according to Embodiment 2 of the present invention.

FIG. 4 shows a circuit diagram for a power switching circuit according to Embodiment 2 of the present invention. The power switching circuit 100 in Embodiment 2 is, in addition to the circuit in FIG. 1 of Embodiment 1, provided with a free-wheel diode 20 connected in parallel with the main MOSFET 1 and main body diode 3. When the free-wheel diode 20 is used, a current is divided to flow through the main body diode 3, the sense body diode 4, and the free-wheel diode 20, which therefore produces merits such as capability of reducing loss as a whole. Moreover, when this is applied to a synchronous rectifier circuit, the current also flows in parallel through the main MOSFET 1; therefore the free-wheel diode 20 can also be miniaturized.

When the free-wheel diode 20 is used, a reverse overcurrent is divided to flow through the free-wheel diode 20, the main body diode 3, and the sense body diode 4. Therefore, the current flowing through the sense body diode 4 becomes low compared to Embodiment 1, so the level to detect the reverse overcurrent may also be set low compared to Embodiment 1. Protection against any reverse overcurrent becomes possible in this Embodiment 2 as well, so that the free-wheel diode and body diodes can be protected from deteriorating and breaking down.

Additionally, a pin diode or Schottky barrier diode can be used for the free-wheel diode 20. Moreover, the free-wheel diode, the same as the switching elements, may also be made of wide bandgap semiconductor with a wider bandgap than silicon, other than those made of silicon. The wide bandgap semiconductor includes, for example, silicon carbide, gallium nitride-based material, and diamond. When the wide-bandgap semiconductor is used, its allowable high current density and low power loss will make it possible to miniaturize a device using power semiconductor elements. Furthermore, when the wide-bandgap semiconductor is used for the free-wheel diode, the withstand voltage of the Schottky barrier diode is raised, thereby enabling its applications to extend to a higher voltage region. When the Schottky barrier diode is used, its on-voltage at an overcurrent is high, so that effects by this invention will be particularly enhanced.

Embodiment 3

Figure 5:
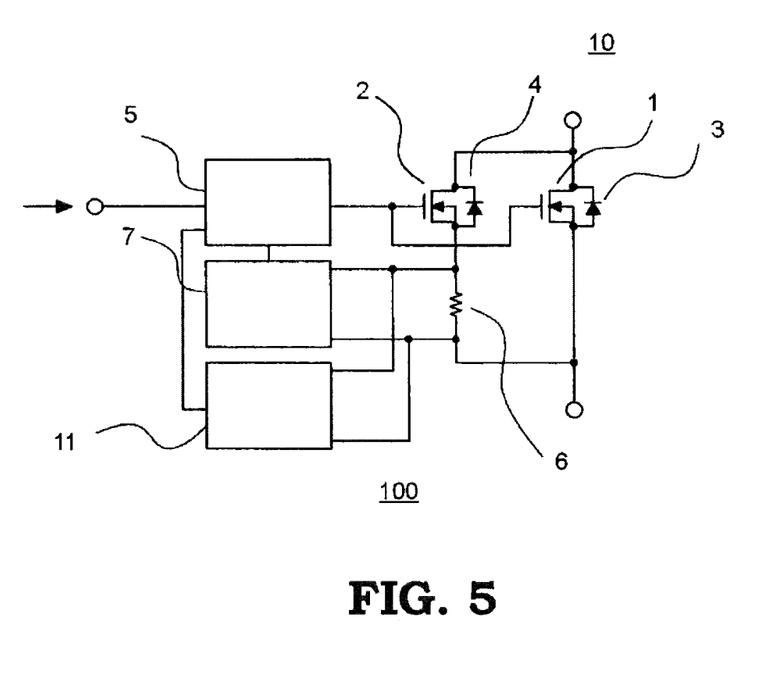
FIG. 5 is a circuit diagram showing a power switching circuit according to Embodiment 3 of the present invention.

FIG. 5 shows a circuit diagram for a power switching circuit according to Embodiment 3 of the present invention. The power switching circuit 100 in this Embodiment 3 includes, in addition to Embodiment 1, a forward overcurrent detection circuit 11. The forward overcurrent detection circuit 11 detects by the voltage drop across the sense resistor 6 whether or not a forward overcurrent is flowing, and which is configured with, for example, a comparator or the like that compares a reference voltage for setting an overcurrent detection level with the voltage across the sense resistor. When an overcurrent flows through the main MOSFET 1 and sense MOSFET 2 in their forward direction, the forward overcurrent detection circuit 11 detects the overcurrent, and then the control circuit 5 turns off the main MOSFET 1 and sense MOSFET 2. The turning-off speed may be slower than that in the normal operation.

Figure 6:
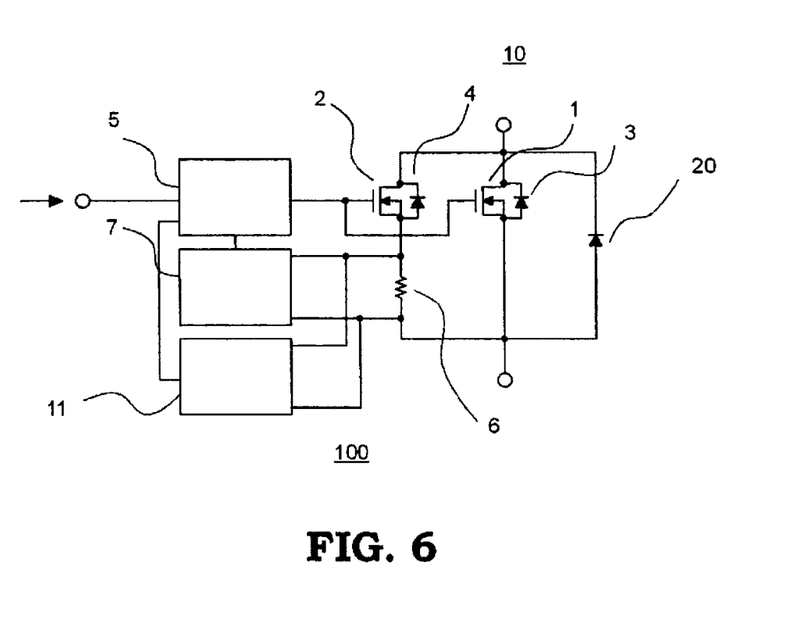
FIG. 6 is a circuit diagram showing another power switching circuit according to Embodiment 3 of the present invention.

Additionally, it goes without saying that the forward overcurrent detection circuit 11 may be provided in the circuit with the free-wheel diode 20 connected in parallel as shown in FIG. 6. In this Embodiment 3, protection becomes possible against a forward overcurrent as well as a reverse overcurrent. Moreover, since the same sense MOSFET and sense body diode are used for detecting the forward overcurrent and reverse overcurrent in this Embodiment 3, only one sense MOSFET and one sense body diode are required, so that the circuit can be simplified.

Embodiment 4

Figure 7:
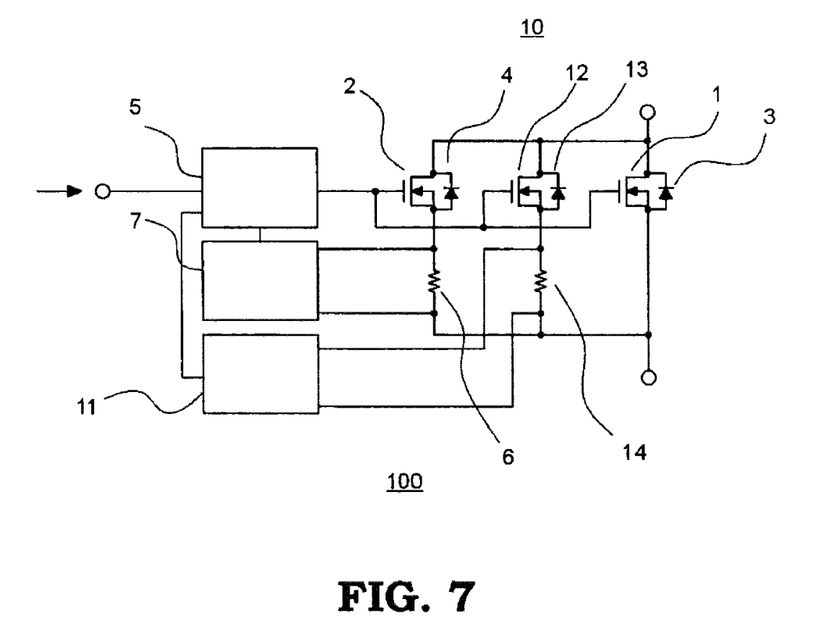
FIG. 7 is a circuit diagram showing a power switching circuit according to Embodiment 4 of the present invention.

FIG. 7 shows a circuit diagram for a power switching circuit according to Embodiment 4 of the present invention. In this Embodiment 4, the reverse overcurrent is detected by the sense MOSFET 2, the sense body diode 4, and the sense resistor 6, while the forward overcurrent is detected by a sense MOSFET 12, a sense body diode 13, and a sense resistor 14. As described above, different sense MOSFETs and different sense body diodes are used for detecting the forward overcurrent and reverse overcurrent. When the sense switching element is configured including a plurality of chips as described above, the element may be configured to detect the forward overcurrent and reverse overcurrent using different chips for each current. Moreover in such configuration, chips with the same structure may be used for detecting both forward overcurrent and reverse overcurrent, or chips with different structures, such as those with different cell ratios, may be used.

Figure 8:
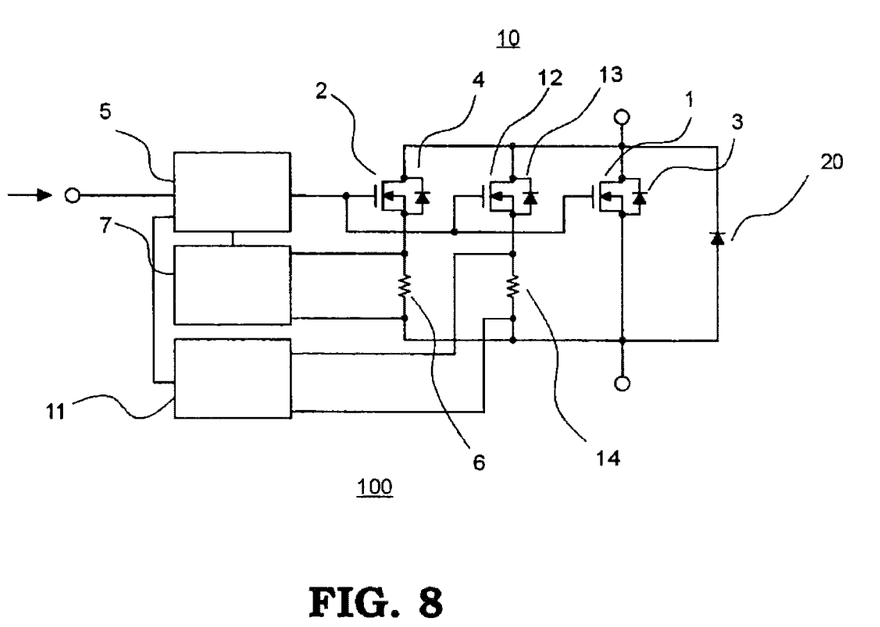
FIG. 8 is a circuit diagram showing another power switching circuit according to Embodiment 4 of the present invention.

Additionally, it goes without saying also in this Embodiment 4 that the forward overcurrent detection circuit 11 may be provided in the circuit with the free-wheel diode 20 connected in parallel as shown in FIG. 8. In this Embodiment 4, protection against a forward overcurrent and reverse overcurrent becomes possible, and in addition, since the forward overcurrent and reverse overcurrent are detected by different sense MOSFETs and different sense body diodes, setting of the sense resistor values and so forth can be made independently, so that the setting will be eased.

DESCRIPTION OF THE REFERENCE NUMERALS

1: main MOSFET (main switching element)
2, 12: sense MOSFET (sense switching element)
3: main body diode
4, 13: sense body diode
5: control circuit
6, 14: sense resistor
7: reverse overcurrent detection circuit
10: power semiconductor element
11: forward overcurrent detection circuit
20: free-wheel diode
100, 100a, 100b, 100c, 100d, 100e, 100f: power switching circuit

The invention claimed is:

1. A power switching circuit, comprising:
a power semiconductor element that includes a main switching element connected in parallel with a main body diode and a sense switching element connected in parallel with a sense body diode;
a reverse overcurrent detection circuit that detects an overcurrent flowing in a reverse direction out of currents flowing through a parallel-connection body of the sense switching element and the sense body diode; and
a control circuit that drives a gate of the power semiconductor element; wherein
when the reverse overcurrent detection circuit detects a reverse overcurrent, the control circuit controls the main switching element and the sense switching element to turn on.

2. A power switching circuit according to claim 1, wherein a free-wheel diode is connected in parallel with the main switching element.

3. A power switching circuit according to claim 1, wherein the control circuit turns off the main switching element and the sense switching element by receiving a signal indicating that the reverse overcurrent detection circuit detects the reverse overcurrent having decreased to lower than a predetermined value after controlling the main switching element and the sense switching element to turn on.

4. A power switching circuit according to claim 1, wherein a forward overcurrent detection circuit is provided that detects an overcurrent flowing in a forward direction out of the currents flowing through the parallel-connection body of the sense switching element and the sense body diode.

5. A power switching circuit according to claim 4, wherein the parallel-connection body of the sense switching element and the sense body diode, which is connected to the reverse overcurrent detection circuit, and another parallel-connection body of a sense switching element and a sense body diode, which is connected to the forward overcurrent detection circuit, are different parallel-connection bodies from each other.

6. A power switching circuit according to claim 1, wherein at least part of the power semiconductor element is made of wide-bandgap semiconductor that has a wider bandgap than silicon.

7. A power switching circuit according to claim 2, wherein the free-wheel diode is made of wide-bandgap semiconductor that has a wider bandgap than silicon.

8. A power switching circuit according to claim 6, wherein the wide-bandgap semiconductor is any one of silicon carbide, gallium nitride-based material and diamond.

9. A power switching circuit according to claim 7, wherein the wide-bandgap semiconductor is any one of silicon carbide, gallium nitride-based material and diamond.

* * * * *